United States Patent
Ito et al.

(10) Patent No.: US 7,064,049 B2
(45) Date of Patent: Jun. 20, 2006

(54) ION IMPLANTATION METHOD, SOI WAFER MANUFACTURING METHOD AND ION IMPLANTATION SYSTEM

(75) Inventors: Hiroyuki Ito, Narita (JP); Yasuhiko Matsunaga, Narita (JP)

(73) Assignee: Applied Materials, Inv., Santa Clara, CA (US)

( * ) Notice: Subject to any disclaimer, the term of this patent is extended or adjusted under 35 U.S.C. 154(b) by 46 days.

(21) Appl. No.: 10/630,293

(22) Filed: Jul. 30, 2003

(65) Prior Publication Data

US 2004/0038505 A1  Feb. 26, 2004

(30) Foreign Application Priority Data

Jul. 31, 2002  (JP)  ............................ P2002-223614

(51) Int. Cl.
*H01L 21/26*  (2006.01)
(52) U.S. Cl. ...................... 438/514; 438/515; 438/517; 438/257; 438/E21.043
(58) Field of Classification Search ................ 438/514, 438/515, 517, 154; 257/E21.043
See application file for complete search history.

(56) References Cited

U.S. PATENT DOCUMENTS

| 5,523,652 | A | * | 6/1996 | Sferlazzo et al. | ........ | 315/111.41 |
| 5,620,522 | A | * | 4/1997 | Ichimura et al. | ..... | 118/723 MR |
| 2005/0070073 | A1 | * | 3/2005 | Al-Bayati et al. | .......... | 438/460 |

FOREIGN PATENT DOCUMENTS

| JP | 51-119287 | 10/1976 |
|---|---|---|
| JP | 52-044155 | 4/1977 |
| JP | 52-052099 | 4/1977 |
| JP | 52-054897 | 5/1977 |
| JP | 52-054898 | 5/1977 |
| JP | 55-161341 | 12/1980 |
| JP | 56-097952 | 8/1981 |
| JP | 60-133646 | 7/1985 |
| JP | 60-195853 | 10/1985 |
| JP | 60-195854 | 10/1985 |
| JP | 60-232652 | 11/1985 |
| JP | 60-243952 | 12/1985 |
| JP | 60-243953 | 12/1985 |
| JP | 60-243955 | 12/1985 |
| JP | 60-243957 | 12/1985 |
| JP | 61-007452 | 1/1986 |
| JP | 61-107643 | 5/1986 |
| JP | 62-071147 | 4/1987 |
| JP | 62-086640 | 4/1987 |
| JP | 62-108441 | 5/1987 |

(Continued)

*Primary Examiner*—George Fourson
(74) *Attorney, Agent, or Firm*—Patterson & Sheridan

(57) ABSTRACT

The present invention provides an ion implantation method which can achieve sufficient throughput by increasing a beam current even in the case of ions with a small mass number or low-energy ions, an SOI wafer manufacturing method, and an ion implantation system. When ions are implanted by irradiating a semiconductor substrate with an ion beam, predetermined gas is excited in a pressure-reduced chamber to generate plasma containing predetermined ions, a magnetic field is formed by a solenoid coil or the like along an extraction direction when the ions are extracted to the outside of the chamber, and the ions are extracted from the chamber with predetermined extraction energy. The formation of the magnetic field promotes ion extraction, but this magnetic field has no influence on an advancing direction of the extracted ions. Therefore, the ion beam current can be kept at a high level-to contribute to the ion implantation.

11 Claims, 8 Drawing Sheets

| | FOREIGN PATENT DOCUMENTS | | JP | 06-231710 | 8/1994 |
|---|---|---|---|---|---|
| | | | JP | 06-267472 | 9/1994 |
| JP | 62-140339 | 6/1987 | JP | 09-245705 | 9/1997 |
| JP | 01-128335 | 5/1989 | JP | 10-012152 | 1/1998 |
| JP | 04-196032 | 7/1992 | JP | 2000-012285 | 1/2000 |
| JP | 05-283194 | 10/1993 | JP | 2000/040475 | 2/2000 |
| JP | 06-036696 | 2/1994 | | | |
| JP | 06-076775 | 3/1994 | * cited by examiner | | |

DOPING GAS

ION IMPLANTATION METHOD, SOI WAFER MANUFACTURING METHOD AND ION IMPLANTATION SYSTEM

BACKGROUND OF THE INVENTION

1. Field of the Invention

The present invention relates to an ion implantation method, an SOI wafer manufacturing method and an ion implantation system.

2. Description of the Related Art

In a field of IC devices, a method for implanting predetermined ions in a semiconductor substrate has conventionally been used when a transistor junction is formed.

Ion implantation is also used in a smart cut method which is one of the manufacturing methods of silicon-on-insulator (SOI) wafers (Japanese Patent Laid-Open Publication No. 2000-12285, etc.). According to the smart cut method, an SOI wafer is manufactured by implanting hydrogen ions in a Si substrate through an insulating layer ($SiO_2$ layer or the like) formed on a surface of the Si substrate, bonding this substrate to another Si substrate and then cutting it at a hydrogen ion implanted layer.

The ion implantation is normally carried out by using an ion implantation system. For an ion source of the ion implantation system, an arc discharge ion source which employs a hot cathode is generally used. With the ion source of this type, it is relatively difficult to generate high-density plasma only by electric arc discharge. Therefore, by forming a magnetic field in a direction penetrating a plasma chamber along the cathode (i.e., orthogonal to an ion extraction direction), plasma generation is promoted and a beam current of extracted ions is improved.

Recent miniaturization and high performance of IC devices have brought about an accelerated reduction in energy of implanted ions. For example, in implanting boron (B), ion energy is required to be less than 1 keV.

However, if ions are implanted by using the above-mentioned conventional ion implantation, the beam current, which is necessary for the ion implantation, is reduced. This beam current reduction tends to occur especially when light (i.e., small mass number) ions or low-energy ions are implanted. Therefore, in processes of forming a transistor junction, an ion implanted layer of an SOI wafer and the like, which require high-dose ion implantation, ions cannot be implanted with proper throughput.

SUMMARY OF THE INVENTION

The present invention was made to deal with the foregoing problems inherent in the prior art, and objects of the invention are to provide an ion implantation method which can achieve sufficient throughput by increasing a beam current when ions are implanted in a semiconductor substrate, even in the case of ions with a small mass number or low-energy ions, and to provide an SOI wafer manufacturing method, and to provide an ion implantation system.

As a result of earnest studies conducted to achieve the objects, the inventors have found out that the ion beam current reduction occurs in the conventional ion implantation system because ions are bent by a magnetic field formed to promote ion extraction, and some of the ions collide against an extraction electrode and the like. Based on the finding and knowledge, the inventors have completed the present invention.

In order to solve the problems, an ion implantation method of the present invention for implanting ions by irradiating a semiconductor substrate with an ion beam includes the steps of: exciting predetermined gas in a pressure-reduced chamber to generate plasma containing ions with a predetermined mass number; forming a magnetic field along an extraction direction of the ions when the ions are extracted to the outside of the chamber; and extracting the ions from the chamber with predetermined extraction energy.

As described above, by forming the magnetic field along the ion extraction direction when the ions are extracted to the outside of the chamber, the ion extraction is promoted by the magnetic field, thereby improving an ion beam current. At this time, since the magnetic field has no influence on an advancing direction of the extracted ions, the ion advancing direction is substantially maintained in the ion extraction direction (i.e., direction of the magnetic field). Thus, a phenomenon that the extracted ions are bent by the magnetic field to collide against the extraction electrode and the like does not occur. Therefore, since the extracted ions are implanted while the beam current is kept at a high level, it is possible to achieve sufficiently high throughput even in implanting ions with a small mass number or low-energy ions in the semiconductor substrate.

According to the ion implantation method of the invention, the mass number of the ions may be 20 or lower.

According to the ion implantation method of the invention, the extraction energy of the ions may be 10 keV or lower, further 1 keV or lower.

The above-mentioned advantage provided by the present invention is lager as the ion mass number is smaller and the extraction energy is smaller. Accordingly, ion implantation can be suitably carried out by using such ions with a small mass number and/or ions with small extraction energy.

According to the ion implantation method of the invention, the gas may be at least one selected from hydrogen gas, helium gas and boron gas.

According to the ion implantation method of the invention, the gas may be excited by arc discharge to generate the plasma. When the plasma is generated by arc discharge, by forming the magnetic field along the ion extraction direction, it is possible to realize high-level throughput without requiring great improvement in or enlargement of the ion source or the like. This plasma generation by the arc discharge is very useful in that production efficiency can be improved without any increases in facility costs and running costs.

According to the ion implantation method of the invention, the gas may be excited by a microwave to generate the plasma.

According to the ion implantation method of the invention, the gas may be hydrogen gas, and the hydrogen gas may be excited by a microwave to generate plasma containing hydrogen molecular ions. Incidentally, in the conventional method, hydrogen atom ions ($H^+$) are generally used when hydrogen ions are implanted.

According to the ion implantation method of the invention, for the semiconductor substrate, a Si substrate having an insulating layer thereon may be used, and the Si substrate may be irradiated with the hydrogen molecular ions from the insulating layer side to implant the hydrogen molecular ions at a predetermined depth of the Si substrate.

According to the ion implantation method of the invention, for the semiconductor substrate, a Si substrate having a $SiO_2$ layer thereon may be used, and the Si substrate may be irradiated with the hydrogen molecular ions from the $SiO_2$ layer side to implant the hydrogen molecular ions at a predetermined depth of the Si substrate.

An SOI wafer manufacturing method of the present invention includes: an ion implantation step of forming a hydrogen ion implanted layer at a predetermined depth of a first wafer having an insulating layer on one surface of a Si substrate; a lamination step of laminating a second wafer constituted of a Si substrate on the insulating layer of the first wafer after the ion implantation step, to obtain a laminated body; and a cutting step of cutting the laminated body at the hydrogen ion implanted layer. In the ion implantation step, the hydrogen ion implanted layer is formed by the foregoing ion implantation method of the present invention.

According to the above manufacturing method, the hydrogen ion implanted layer is formed at the predetermined depth of the first wafer (insulating layer/Si substrate), and the second wafer is laminated on the insulating layer of the first wafer to form the laminated body (Si substrate/insulating layer/Si layer/hydrogen ion implanted layer/Si substrate). This laminated body is cut at the hydrogen ion implanted layer to obtain the SOI wafer (Si layer/insulating layer/Si substrate). At this time, by applying the ion implantation method of the invention in the ion implantation step, hydrogen ions can be efficiently implanted at a predetermined depth of the Si substrate, thus greatly improving throughput. Accordingly, the manufacturing method is very useful in that the SOI wafer excellent in high integration, etc. can be efficiently and surely manufactured.

An ion implantation system of the present invention for implanting ions by irradiating a semiconductor substrate with an ion beam includes: an ion source for exciting predetermined gas in a pressure-reduced chamber to generate plasma containing ions with a predetermined mass number; a magnet for forming a magnetic field along an extraction direction of the ions when the ions are extracted to the outside of the chamber; and an extraction electrode for extracting the ions from the chamber with predetermined extraction energy.

According to the ion implantation system, since ion extraction is promoted by the magnetic field formed along the ion extraction direction when the ions are extracted to the outside of the chamber, a beam current is improved. Moreover, since an extracted ion beam is not bent by the magnetic field, the beam current is kept at a high level. As a result, ion implantation can be carried out with sufficiently high throughput.

According to the ion implantation system of the invention, the ion source may generate plasma containing ions with a mass number 20 or lower.

According to the ion implantation system of the invention, the extraction electrode may extract the ions by use of extraction energy of 10 keV or lower.

According to the ion implantation system of the invention, the magnet may be a solenoid coil wound around the outside of the chamber along the ion extraction direction.

According to the ion implantation system of the invention, the magnet may be a permanent magnet disposed on an opposite side to the extraction electrode of the ion source so that an N pole of the permanent magnet is arranged on a side near the extraction electrode and an S pole thereof is arranged on a side far from the extraction electrode.

According to the ion implantation system of the invention, the magnet may be an electromagnet disposed on an opposite side to the extraction electrode of the ion source. The electromagnet includes a core material made of soft steel or a magnetic substance, and a solenoid coil wound around an outer periphery of the core material in a predetermined direction.

DETAILED DESCRIPTION OF THE PREFERRED EMBODIMENT

Figure 1:
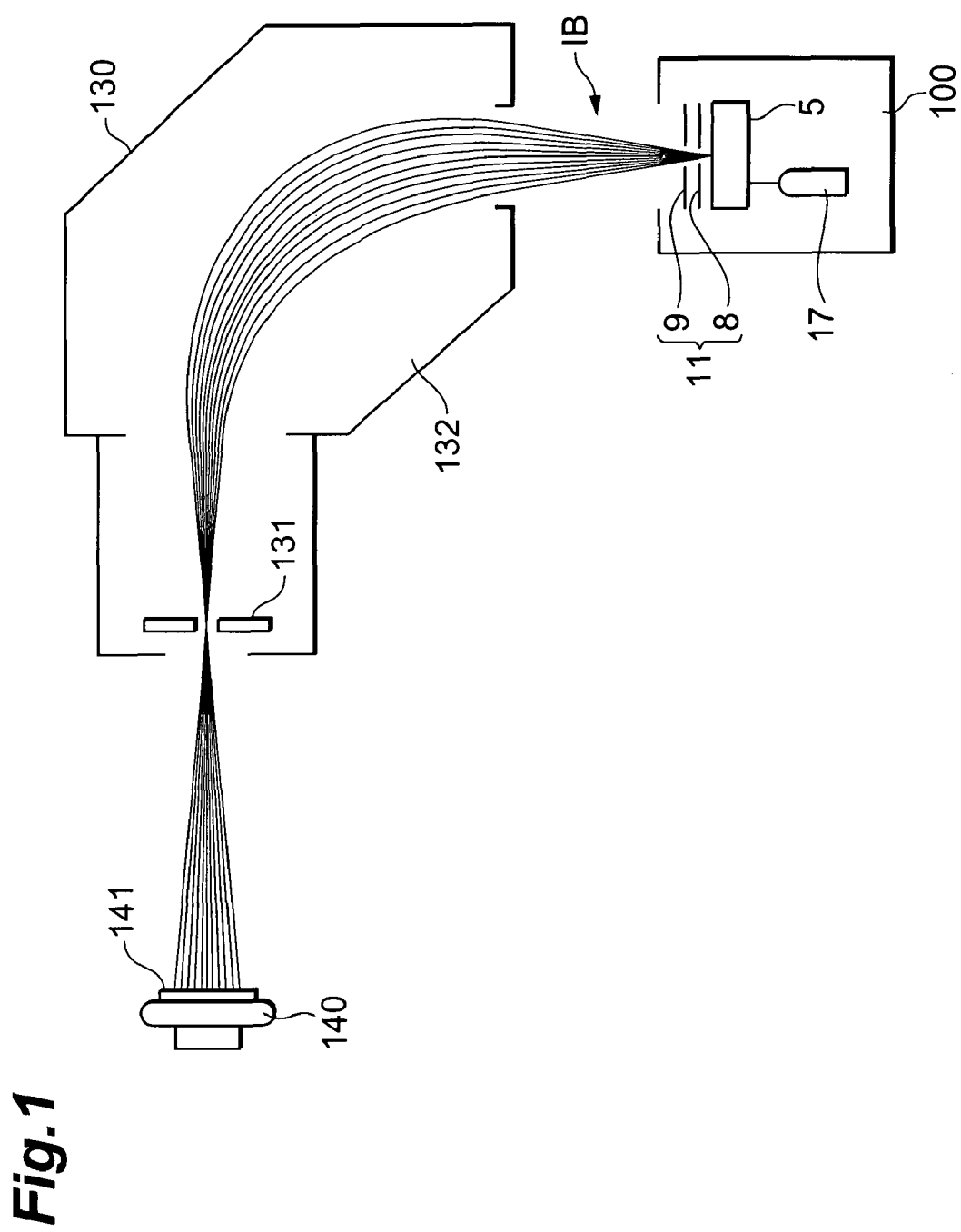
FIG. 1 is an explanatory view showing an example of an ion implantation system of the present invention.

The preferred embodiments of the present invention will now be described with reference to the accompanying drawings. In the drawings, similar or equivalent portions will be denoted by similar reference numerals, and repeated explanation will be omitted.

First, an ion implantation method and an ion implantation system will be described.

FIG. 1 is an explanatory view schematically showing an example of an ion implantation system of the present invention. The system shown in FIG. 1 comprises an ion extraction assembly 100 which includes an arc discharge ion source 5, a cylinder 17 for supplying predetermined gas to the ion source 5 and a pair of extraction electrodes 8 and 9; an ion mass selector 130; and a target substrate holder 140.

Figure 2:
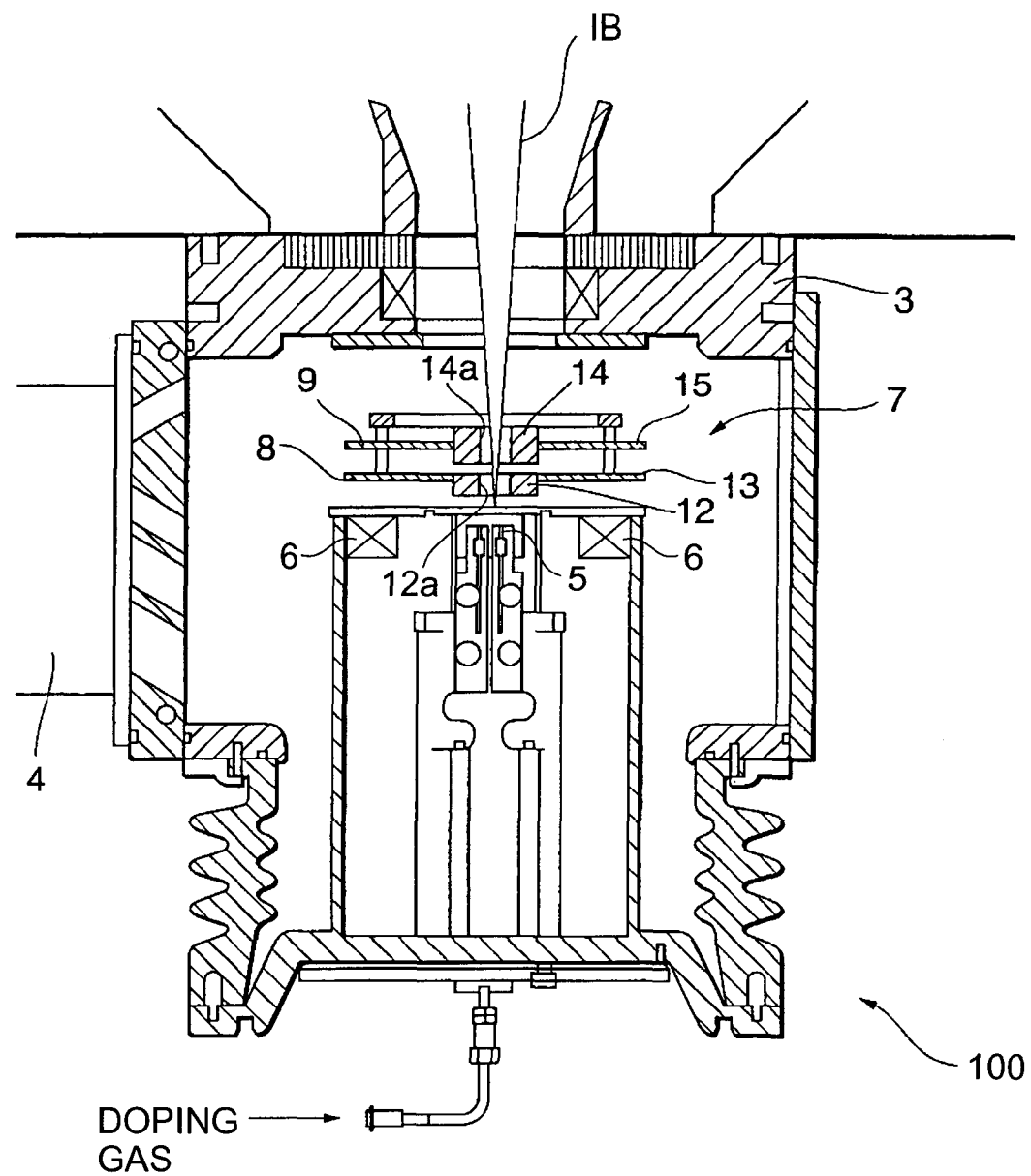
FIG. 2 is a sectional view showing a schematic constitution of an ion extraction assembly 100 included in the ion implantation system of FIG. 1.

FIG. 2 is a sectional view showing a schematic constitution of the ion extraction assembly 100. In the drawing, the ion extraction assembly 100 has a source chamber 3, and pressure in this source chamber 3 is reduced to a predetermined degree of vacuum by a turbo pump 4. The ion source 5 is housed in the source chamber 3.

The ion source 5 is an arc discharge type, which causes doping gas, introduced from a gas supply source (not shown) into a plasma chamber, to discharge so as to generate a plasma state and ionize predetermined elements (molecules). The introduced gas is for generating ions with a mass number 20 or lower. For example, one of hydrogen gas, helium gas and boron gas, or a mixed gas of two or more of these is suitably used.

In the source chamber 3, a solenoid coil 6 wound in a predetermined direction is arranged around the ion source 5. A current is supplied to the solenoid coil 6 to form a magnetic field along an ion extraction direction by an extraction electrode system 7 to be described below.

On the front side of the ion source 5, the extraction electrode system 7 is arranged to extract ions generated by the ion source 5. As shown in FIG. 2, the extraction electrode system 7 has the pair of extraction electrodes 8 and 9 arranged facing each other. The extraction electrode 8 is a main electrode, and the extraction electrode 9 is a ground electrode.

The main electrode 8 includes an electrode main body 12 having a slit 12a for allowing an ion beam IB to pass therethrough, and a disk-shaped attaching plate 13 constituted to surround the electrode main body 12. The ground electrode 9 includes an electrode main body 14 having a slit 14a for allowing the ion beam IB to pass therethrough, and a disk-shaped attaching plate 15 constituted to surround the electrode main body 14. The attaching plate 13 of the main electrode 8 is fixed to the source chamber 3 through a support member 16a. The attaching plate 15 of the ground electrode 9 is fixed to the source chamber 3 through a support member 16b.

The slits 12a and 14a may be similar or different in diameter, which is determined in accordance with ion implantation conditions and the like. Two or more slits different in diameter may be disposed in each of the electrode main bodies 12 and 14 to switch an extraction position of the ion beam IB.

In the ion extraction assembly 100 having such a structure, when a desired voltage is applied between the ion source 5 and the extraction electrode (main electrode) 8, ions are extracted and accelerated to form the ion beam IB. For example, when extracting positive ions, the ion source 5 is kept at a positive voltage with respect to the ground electrode 9, while the main electrode 8 is kept at a negative voltage with respect to the ground electrode 9. Ion extraction energy at this time is obtained by the following equation (1). According to the present invention, the ion extraction energy is set to 10 keV or lower, preferably 1 keV or lower.

$$E = ZV(eV) = ZeV(J) \quad (1)$$

(In the equation (1), E denotes ion extraction energy, Z denotes the number of ion charges, V denotes an extraction voltage (potential difference between the main electrode and the ion source), and e denotes an electron charge.)

Figure 3:
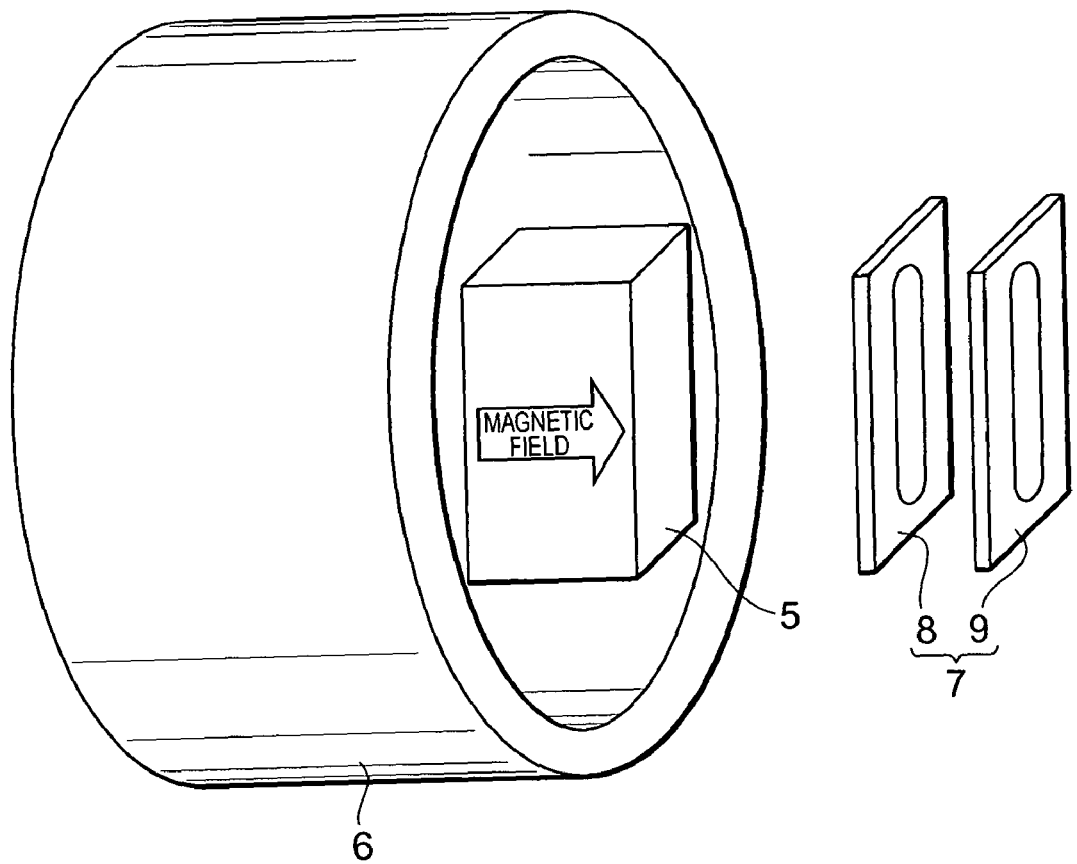
FIG. 3 is a conceptual view showing a relationship between a direction of a magnetic field formed by a solenoid coil 6 and an ion extraction direction.

The ion extraction is promoted by the magnetic field formed along the ion extraction direction by the solenoid coil 6. FIG. 3 conceptually shows a relationship between the ion extraction direction and the direction of the magnetic field formed by the solenoid coil 6 in this case. As shown in the drawing, when a current is supplied in a predetermined direction of the solenoid coil 6, the magnetic field is formed along the ion extraction direction, i.e., from the ion source 5 toward the slits 12a and 14a of the respective extraction electrodes 8 and 9 to promote the ion extraction from the ion source 5. At this time, an advancing direction of the ions extracted from the ion source 5 is substantially maintained in the ion extraction direction (i.e., direction of the magnetic field), and a phenomenon that the extracted ions are bent by the magnetic field to collide against the extraction electrode system 7 and the like does not occur. Therefore, an ion beam current is maintained at a high level.

Returning to FIG. 1, the ion beam IB from the ion extraction assembly 100 is directed to the target substrate holder 140 through the ion mass selector 130.

The ion mass selector 130 comprises a magnetic sector mass analyzer 132 operated cooperatively with mass and a mass selection slit 131. The magnetic sector mass analyzer 132 includes an area of a magnetic field perpendicular to the paper surface of FIG. 1. In this magnetic field, a constant-speed ion kind having a predetermined mass/charge ratio is taken out. The slit 131 allows only the necessary ion beam IB to pass therethrough among ion beams from the magnetic sector mass analyzer 132. The slit 131 and the magnetic sector mass analyzer 132 are surrounded with housing, or formed with a mechanism having a tube put therethrough, and the pressure inside is reduced to a predetermined degree of vacuum by a turbo pump (not shown).

Then, predetermined ions with a mass number 20 or lower are selected from the ion beam IB passing through the ion mass selector 130, and a target substrate 141 fixed to the target substrate holder 140 is irradiated with the selected ions.

As described above, according to the first embodiment, the plasma containing the predetermined ions is generated by the arc discharge ion source 5 and, when the ions are extracted from the plasma to the outside of the source chamber 3 with the predetermined ion extraction energy, the magnetic field is formed along the ion extraction direction by the solenoid coil 6. Accordingly, the ion extraction from the ion source 5 is promoted without bending of the extracted ions by the magnetic field, and the ion beam current can be maintained at a high level. By irradiating the target substrate 141 with the extracted ions through the ion mass selector 130, it is possible to carry out ion implantation with sufficiently high throughput even in the case of ions with a mass number 20 or lower, and/or ions with extraction energy 10 keV or lower (further, 1 keV or lower).

Moreover, the solenoid coil 6 is arranged around the arc discharge ion source 5 to form the magnetic field. Thus, high-level throughput can be achieved without any great improvement in or enlargement of the ion source 5 or the like.

Further, the prevention of ion collision against the extraction electrodes by the magnetic field formation can provide advantages such as a longer life of the extraction electrodes and the like, a reduction in particle contamination, and a longer life of the vacuum pump.

As means for forming the magnetic field along the ion extraction direction, a permanent magnet or an electromagnet to be described later can be used in place of the solenoid coil 6.

Figure 4:
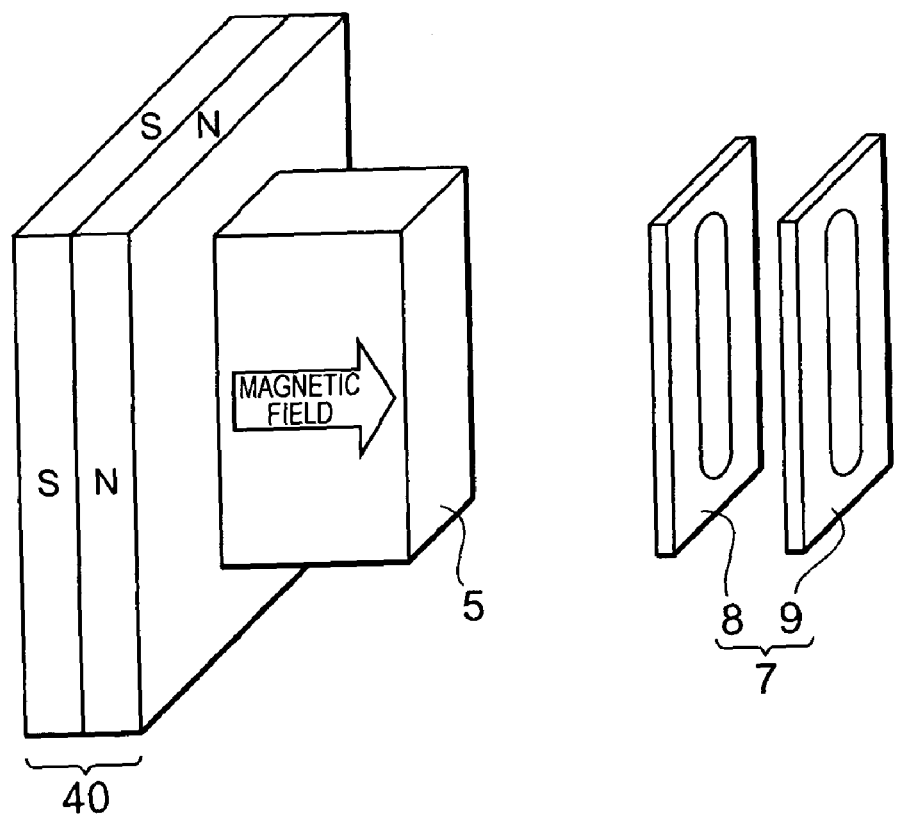
FIG. 4 is a conceptual view showing a relationship between a direction of a magnetic field formed by a permanent magnet 40 and the ion extraction direction.

That is, as shown in FIG. 4, a permanent magnet 40 is arranged on the backside (opposite side to the extraction electrodes) of the ion source 5 so that a side of the permanent magnet 40 near the extraction electrodes is an N pole and a side thereof far from the extraction electrodes is an S pole, whereby a magnetic field is formed along the ion extraction direction. Thus, advantages similar to those of the solenoid coil 6 can be obtained. Note that the permanent magnet may be arranged so that the side near the extraction electrode is an S pole, and the side far from the extraction electrode is an N pole as, long as the magnetic field is formed along the ion extraction direction.

Figure 5:
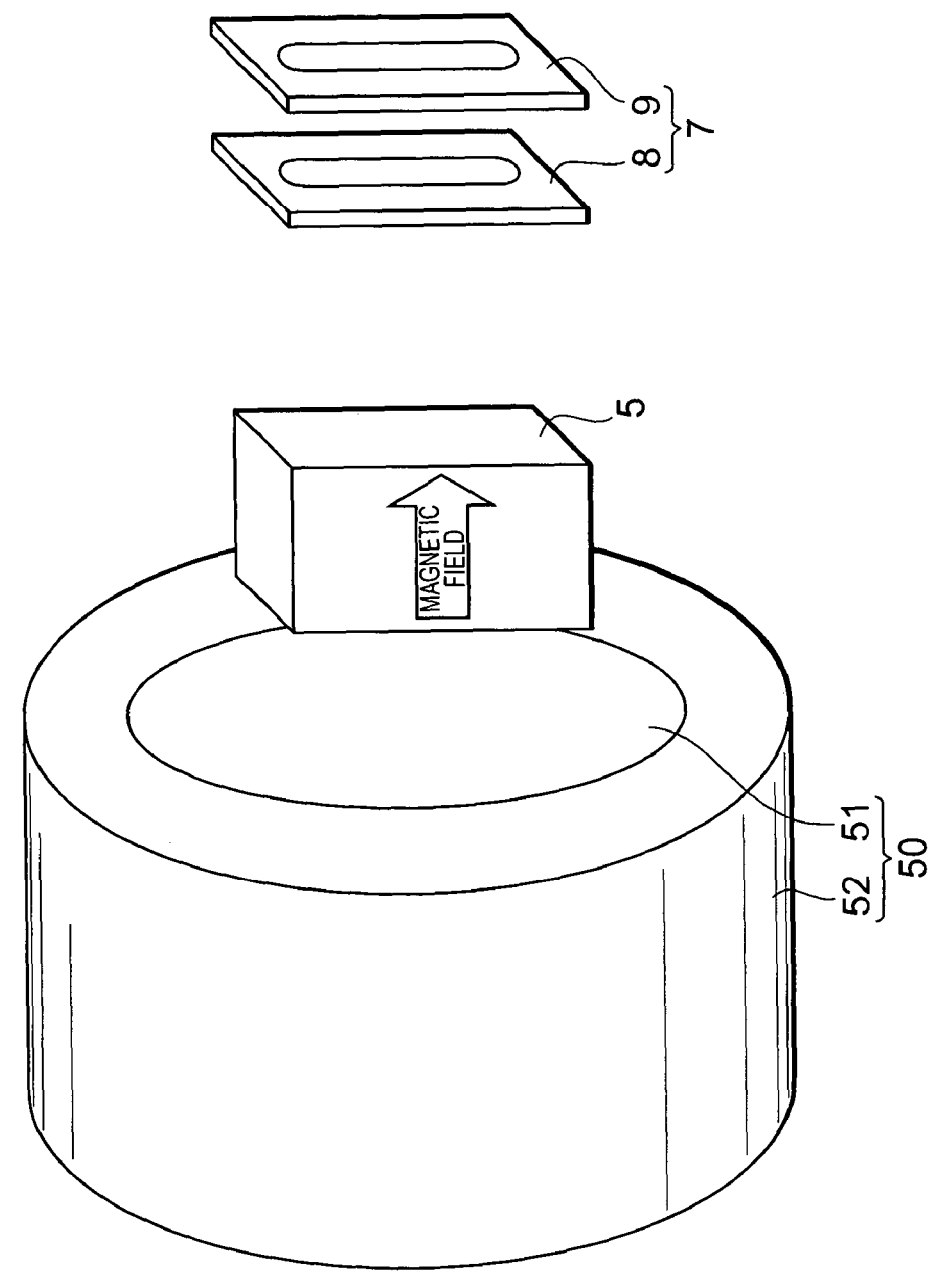
FIG. 5 is a conceptual view showing a relationship between a direction of a magnetic field formed by an electromagnet 50 and the ion extraction direction.

As shown in FIG. 5, on the backside (opposite side to the extraction electrode) of the ion source 5, an electromagnet 50 which comprises a core material 51 made of soft steel or a magnetic substance and a solenoid 52 wound around the core material 51 in a predetermined direction is arranged, whereby a magnetic field is formed along the ion extraction direction. Thus, advantages similar to those of the solenoid coil 6 can be obtained.

Moreover, a microwave ion source may be used as the ion source, as described later, as long as the magnetic field can be formed along the ion extraction direction. Hereinafter, as another example of the present invention, the case of implanting hydrogen ions by using the microwave ion source will be described. The microwave ion source can be applied to implantation of boron or other elements.

Figure 6:
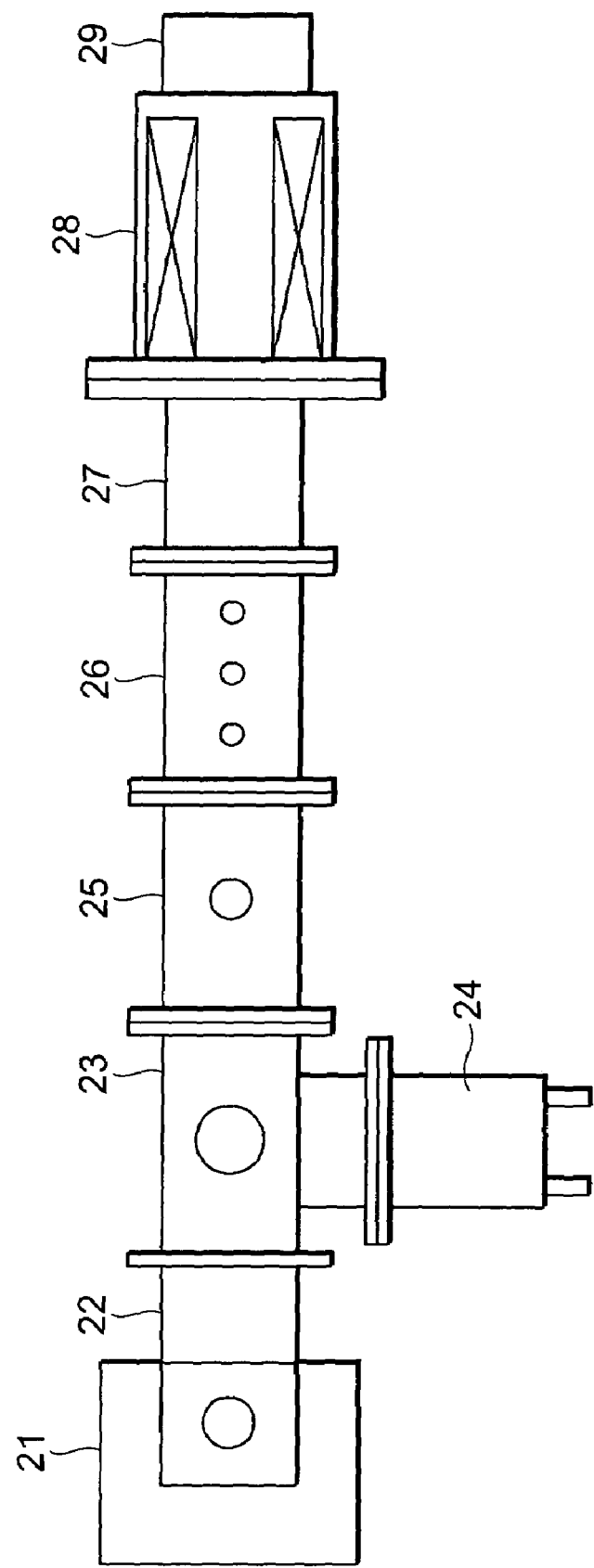
FIG. 6 is a schematic diagram showing an example of a microwave ion source used in the present invention.

FIG. 6 is a schematic diagram showing an example of the microwave ion source which can replace the arc discharge ion source 5 of FIG. 1. In FIG. 6, a magnetron 21, a magnetron mount 22, a circulator 23, a power monitor 25, a stub tuner 26, an interface tube 27, and a source head 28 are connected in this order to constitute the microwave ion source. A plasma chamber 29 is disposed on the front of the source head 28. A dummy load 24 is disposed on a side of the circulator 23.

The magnetron 21 generates a predetermined microwave (e.g., 2.45 GHz) which is introduced to the source head 28 to generate plasma. The circulator 23 diverts a reflected microwave tending to return toward the magnetron 21 to the dummy load 24, and the diverted microwave is absorbed by the dummy load 24 to be converted into heat. The stub tuner 26 regulates the reflection of the microwave so that the reflection becomes smaller and more microwaves can be consumed for plasma generation. The power monitor 25 for detecting an output of the microwave, the interface tube 27 and the like are not essential and can be omitted as occasion demands.

Figure 7:
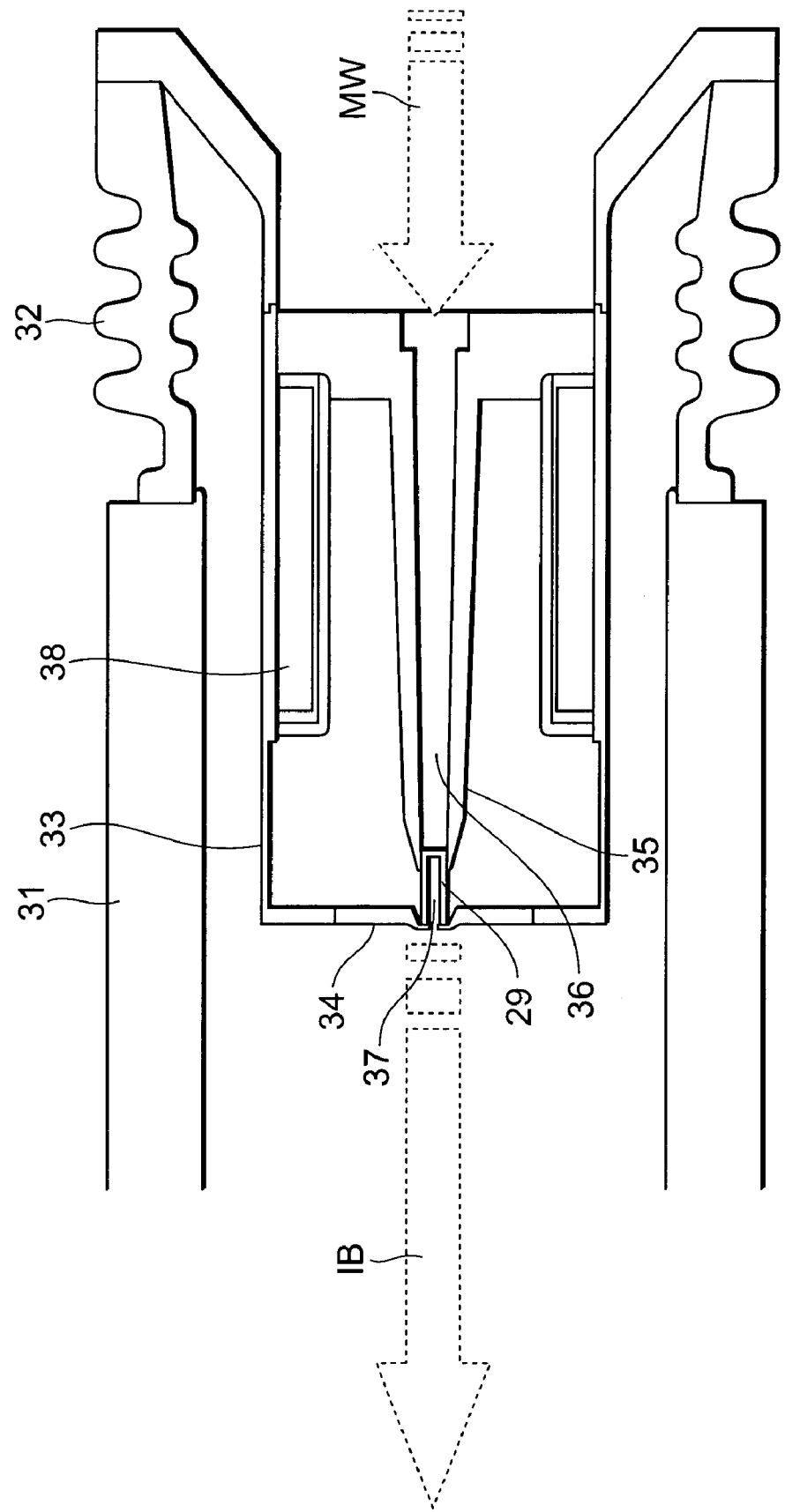
FIG. 7 is a sectional view when a source head 28 of the microwave ion source of FIG. 6 is cut by a plane including a microwave introduction path.

FIG. 7 is a sectional view when the source head 28 is cut by a plane including a microwave introduction path. In FIG. 7, a source bushing 32 is formed on the magnetron side (microwave MW inlet side) of the source chamber 31. An end of the source bushing 32 is bent to the inside of the source head. A magnet yoke 33 is provided in a tip of the bent portion of the source bushing 32 to form a space for the source head 28 inserted. An outlet-side plate 34 having an opening is provided on the front of the magnet yoke 33, and the recessed plasma chamber 29 is disposed in the opening on the magnetron side of the plate 34. A recessed space 37 of the plasma chamber 29 is a plasma generation area, to which predetermined gas is supplied.

A projected magnet pole 35 is arranged so that a tip of the projected portion thereof is close to the plasma chamber 29 and a side face of a bottom portion of the magnet pole 35 is in tight contact with an inner wall surface of a side of the magnet yoke 33. A waveguide tube 36 is arranged in the magnet pole 35 to communicate the center of the bottom portion to the tip of the projected portion. The waveguide tube 36 introduces the microwave to the plasma chamber 29.

In a space formed by inner wall surfaces of the magnet yoke 33 and the plate 34, and outer wall surfaces of the plasma chamber 29 and the magnet pole 35, a solenoid coil 38 is arranged to be wound around the projected portion of the magnet pole 35. With this constitution, a magnetic field is formed along the ion extraction direction from the plasma chamber 29.

In the microwave ion source having the above-mentioned constitution, electrons in the magnetic field receive Lorentz force and circle along a magnetic flux line. At this time, when a microwave is introduced to the waveguide tube 26 while hydrogen gas is being introduced into the plasma generation area 37, the electrons in the magnetic field are excited by the microwave, and the excited electrons collide with the gas in the plasma generation area 37 to generate plasma containing hydrogen ions.

The hydrogen ions thus generated are extracted to generate an ion beam and, in a similar manner to the case of the arc discharge ion source, the target substrate 141 is irradiated with the ions through the ion mass selector 130. In this case as well, by forming the magnetic field along the ion extraction direction, it is possible to prevent a phenomenon that an advancing direction of the ions is bent to collide against the extraction electrode system 7 and the like. Accordingly, a high-level beam current can be achieved even in the case of ions with a mass number 20 or lower such as hydrogen ions, and/or ions with extraction energy 10 keV or lower.

According to the present invention, the plasma generation using the microwave ion source may be carried out in ECR mode or in non-ECR mode (Off-ECR mode). When hydrogen gas is used, however, the Off-ECR mode is preferably employed. By carrying out plasma generation in the Off-ECR mode, it is possible to increase generation efficiency of hydrogen molecular ions by use of low-energy electrons, plasma density, current density in hydrogen ion beam IB, and a rate of hydrogen molecular ions.

Note that in the electron cyclotron resonance (ECR) mode, a microwave frequency is matched with an electron cyclotron frequency (frequency of electrons circulating around the magnetic flux line) represented by the following equation (2):

$$\omega_e = \frac{eB}{2\pi m_e} \approx 2.80B \times 10^{10} (\text{Hz}) \qquad (2)$$

(in the equation (2), $\omega_e$ denotes an electron cyclotron frequency, $m_e$ denotes electron mass, e denotes an electron charge, and B denotes magnetic field intensity.) In this manner, electrons are selectively excited in an electron cyclotron resonance absorption process, and the excited electrons are collided with hydrogen molecules, whereby plasma is generated. However, if plasma generation is carried out in the ECR mode, hydrogen atom ions (H$^+$) are easily generated, and current density in a hydrogen ion beam easily becomes insufficient.

On the other hand, in the Off-ECR mode, plasma generation is carried out by not satisfying ECR conditions, i.e., by setting a microwave frequency and magnetic field intensity to satisfy conditions represented by the following equation (3) or (4):

$$\omega > \frac{eB}{2\pi m_e} \qquad (3)$$

$$\omega < \frac{eB}{2\pi m_e} \qquad (4)$$

(in the equations (3) and (4), $\omega$ denotes a microwave frequency, $m_e$ denotes electron mass, e denotes an electron charge, and B denotes magnetic field intensity.) When the Off-ECR mode is set, the magnetic field intensity may be adjusted while the microwave frequency is fixed. Alternatively, the microwave intensity may be adjusted while the magnetic field intensity is fixed.

In the Off-ECR mode, the microwave frequency and the magnetic field intensity are preferably set so that the microwave frequency $\omega$ becomes higher (or lower) by 10 to 50% (more preferably 20 to 40%) than electron cyclotron frequency $\omega_e$. Accordingly, for example, if a microwave of 2.45 GHz is used, preferred magnetic field intensity is 96 to 131 mT or 44 to 79 mT (more preferably, 105 to 123 mT or 53 to 70 mT). If a microwave of 14.5 GHz is used, preferred magnetic intensity is 570 to 777 mT or 259 to 466 mT.

Average stay time of hydrogen molecules from introduction of hydrogen gas into the plasma generation area 37 until extraction of a hydrogen ion beam IB is preferably $5 \times 10^{-4}$ to $5 \times 10^{-3}$ seconds, more preferably $7 \times 10^{-4}$ to $3 \times 10^{-3}$ seconds. A rate of hydrogen molecular ions tends to be lowered when the average stay time exceeds the above upper limit, and plasma generation efficiency tends to be lowered when the average stay time is less than the above lower limit. The average stay time can be set by regulating a shape and a size of the plasma chamber 29, the supplying amount of hydrogen gas, the extraction amount of the hydrogen ion beam IB, etc.

In the conventional method, which uses an arc discharge ion source, an RF ion source or the like, since hydrogen atom ions are generated more easily than hydrogen molecular ions, hydrogen atom ions are almost exclusively used for ion implantation. On the other hand, according to the ion implantation method of the present invention, by using a microwave to generate plasma and forming a magnetic field along the ion extraction direction to extract ions, a rate of hydrogen molecular ions in the plasma can be dramatically increased compared to the conventional method, and further the hydrogen molecular ions can be used with low extraction energy and a high beam current. Therefore, high-level throughput, which was difficult to be achieved conventionally, can be easily realized.

For example, the inventors have verified that ion composition of $H^+$ ions 13.5%, $H_2^+$ ions 78.1% and $H_3^+$ ions 8.4% is achieved when plasma is generated with average stay time of hydrogen ions set to $8.9 \times 10^{-4}$ seconds, in the Off-ECR mode where a microwave frequency is set to 2.45 GHz, a microwave output is set to 700 W, and magnetic field intensity is set to 70 mT. On the other hand, it has been verified that ion composition in plasma which is generated by a conventional arc discharge ion source has $H^+$ ions by 60.2%, $H_2^+$ ions by 22.9% and $H_3^+$ ions by 16.9%.

The ion implantation method and the ion implantation system of the present invention can achieve high-level throughput as described above, and are very useful in processes of forming a transistor junction, an ion implanted layer of an SOI wafer and the like, which require high-dose ion implantation.

Now, an SOI wafer manufacturing method will be described in detail by taking an example of manufacturing an SOI wafer which has a laminated structure of a Si layer, a $SiO_2$ layer and a Si substrate.

FIGS. 8A to 8D are sectional views schematically showing wafer laminated structures in respective steps.

In an ion implantation step, a Si substrate (Si-donor wafer) 81 having a $SiO_2$ layer 82 formed on one surface thereof is used as a target substrate. The $SiO_2$ layer 82 can be formed by, for example, oxidizing a surface of the Si substrate, and has a thickness of, e.g., 0.01 to 1.0 μm.

Figure 8A:
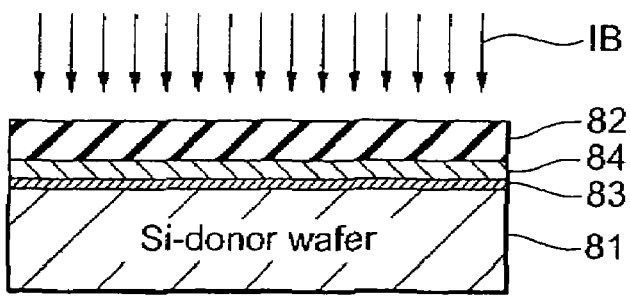
FIGS. 8A to 8D are sectional views schematically showing wafer laminated structures in respective steps.

A hydrogen ion implanted layer 83 is formed at a predetermined depth in the Si substrate 81 by irradiating the target substrate with hydrogen molecular ions from the $SiO_2$ layer 82 side of the wafer. Accordingly, a thin Si layer 84 is formed between the $SiO_2$ layer 82 and the hydrogen ion implanted layer 83 (FIG. 8A).

In the ion implantation step, if the microwave ion source is used, plasma generation is carried out preferably in the Off-ECR mode. Thus, since the generation of hydrogen molecular ions is promoted, very high throughput can be realized and, as a result, it is possible to dramatically increase manufacturing efficiency of an SOI wafer. The inventors have verified that when plasma generation is carried out in the Off-ECR mode and a magnetic field is formed along the ion extraction direction, SOI manufacturing efficiency is increased by 4 or more times compared to a conventional manufacturing method which uses an arc discharge ion source, an RF ion source or the like.

In the ion implantation step, the amount of ion implantation is preferably equal to or higher than $1 \times 10^{16}$ ions/cm². Additionally, the hydrogen ion implanted layer 83 is formed in a position, for example, at a depth of 0.005 to 1.5 μm from an interface between the Si layer 84 and the $SiO_2$ layer 82.

Figure 8B:
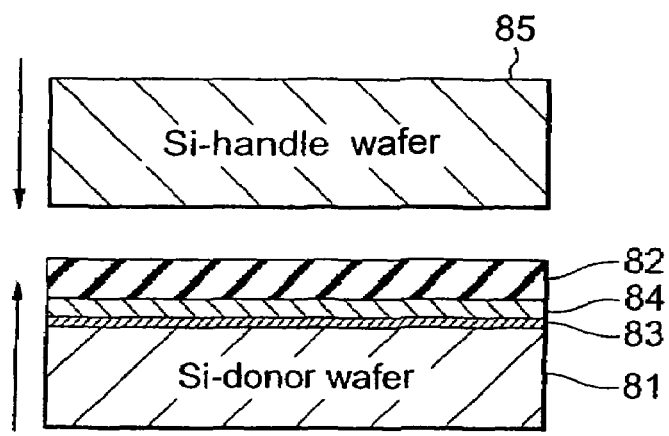

Next, a Si substrate (Si-handle wafer) 85 is bonded to the $SiO_2$ layer 82 of the target substrate (FIG. 8B). Note that a target laminated body can also be obtained by carrying out an ion implantation step similar to the above by use of a Si substrate having no $SiO_2$ layer formed thereon while preparing a Si substrate having a $SiO_2$ layer formed on a surface thereof, and then bonding these substrates in a lamination step.

Figure 8C:
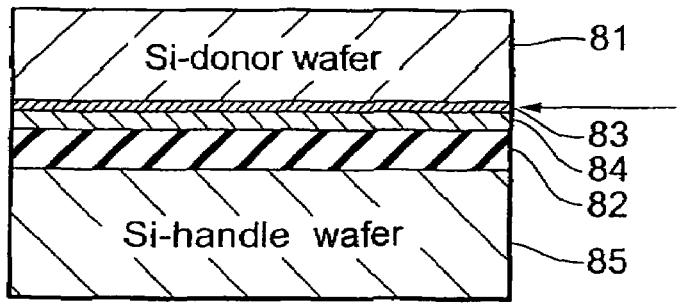

The laminated body is cut at the hydrogen ion implanted layer 83 (FIG. 8C). The hydrogen ion implanted layer 83 is a weak layer where covalent bonding of silicon atoms is cut. Therefore, the hydrogen ion implanted layer 83 can be easily cut by spraying gas such as dry air to a side face of the hydrogen ion implanted layer 83 or applying mechanical shearing.

Figure 8D:
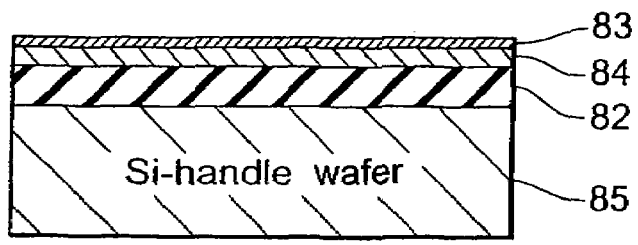

Thus, an SOI wafer which has the $SiO_2$ layer 82 and the Si layer 84 formed in this order on the Si substrate 85 is obtained (FIG. 8D). Incidentally, the hydrogen ion implanted layer 83 may partially remain on the surface of the Si layer 84 after the cutting process. However, such a residue can be easily removed by carrying out a polishing process or the like. Moreover, by further polishing the Si layer 84, a thickness of the Si layer 84 can be regulated.

As described above, according to the ion implantation method and the ion implantation system of the present invention, when ions are extracted to the outside of the chamber, the magnetic field is formed along the ion extraction direction to promote ion extraction, whereby the ion beam current is improved. Moreover, the influence of the magnetic field on the advancing direction of ions is removed to maintain the beam current at a high level. Thus, even in the case of ions with a small mass number (e.g., ions with a mass number 20 or lower) and/or ions with low extraction energy (e.g., ions with extraction energy 10 keV or lower), it is possible to carry out ion implantation with sufficiently high throughput.

According to the SOI wafer manufacturing method of the present invention, it is possible to realize high-level throughput by applying the ion implantation method of the present invention in the ion implantation step, and to efficiently and surely manufacture an SOI wafer excellent in high integration and the like.

The invention claimed is:

1. An ion implantation method for implanting ions comprising:
    exciting a predetermined gas in a pressure-reduced chamber to generate plasma containing ions with a predetermined mass number of 20 or lower;
    forming a magnetic field along an extraction direction of the ions when the ions are extracted to the outside of the chamber;
    extracting the ions from the chamber with a predetermined extraction energy; and
    irradiating a silicon substrate with the ions, wherein the silicon substrate has an insulating layer disposed thereon.

2. An ion implantation method for implanting ions comprising:
    exciting a predetermined gas in a pressure-reduced chamber to generate plasma containing ions with a predetermined mass number;
    forming a magnetic field along an extraction direction of the ions when the ions are extracted to the outside of the chamber;
    extracting the ions from the chamber with a predetermined extraction energy of 10 keV or lower; and irradiating a silicon substrate with the ions, wherein the silicon substrate has an insulating layer disposed thereon.

3. An ion implantation method according to claim 2, wherein the extraction energy of the ions is 1 keV or lower.

4. An ion implantation method according to claim 1, wherein the gas is at least one selected from hydrogen gas, helium gas and boron gas.

5. An ion implantation method according to claim 1, wherein the gas is excited by arc discharge to generate the plasma.

6. An ion implantation method according to claim 1, wherein the gas is excited by a microwave to generate the plasma.

7. An ion implantation method according to claim 6, wherein the gas is hydrogen, and the hydrogen gas is excited by a microwave to generate plasma containing hydrogen molecular ions.

8. An ion implantation method for implanting ions comprising:
    exciting a predetermined gas in a pressure-reduced chamber to generate plasma containing ions with a predetermined mass number, wherein the gas is hydrogen, and the hydrogen gas is excited by a microwave to generate plasma containing hydrogen molecular ions;
    forming a magnetic field along an extraction direction of the ions when the ions are extracted to the outside of the chamber;
    extracting the ions from the chamber with a predetermined extraction energy; and
    irradiating a silicon substrate with the ions, wherein the silicon substrate has an insulating layer disposed thereon, wherein a frequency of the microwave and intensity of the magnetic field satisfy conditions represented by one selected from the following equations:

$$\omega > \frac{eB}{2\pi m_e} \quad (3)$$

$$\omega < \frac{eB}{2\pi m_e} \quad (4)$$

where $\omega$ denotes a frequency of a microwave, $m_e$ denotes electron mass, e denotes an electron charge, and B denotes intensity of a magnetic field.

9. An ion implantation method according to claim 7, wherein average stay time from the introduction of the hydrogen gas into the chamber until the extraction of the hydrogen molecular ions to the outside of the chamber is $5 \times 10^{-4}$ to $5 \times 10^{-3}$ seconds.

10. An ion implantation method according to claim 7, wherein the Si substrate is irradiated with the hydrogen molecular ions from the insulating layer side to implant the hydrogen molecular ions at a predetermined depth of the Si substrate.

11. An ion implantation method according to claim 7, wherein the insulating layer comprises a $SiO_2$ layer and the Si substrate is irradiated with the hydrogen molecular ions from the $SiO_2$ layer side to implant the hydrogen molecular ions at a predetermined depth of the Si substrate.

* * * * *